United States Patent
Horii

(10) Patent No.: US 7,038,261 B2
(45) Date of Patent: May 2, 2006

(54) INTEGRATED CIRCUIT MEMORY DEVICES HAVING MEMORY CELLS THEREIN THAT UTILIZE PHASE-CHANGE MATERIALS TO SUPPORT NON-VOLATILE DATA RETENTION

(75) Inventor: Hideki Horii, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 148 days.

(21) Appl. No.: 10/421,320

(22) Filed: Apr. 23, 2003

(65) Prior Publication Data

US 2003/0209746 A1    Nov. 13, 2003

(30) Foreign Application Priority Data

May 7, 2002    (KR)    ...................... 10-2002-0025009

(51) Int. Cl.
*H01L 29/76*    (2006.01)
(52) U.S. Cl. ....................... 257/295; 257/309
(58) Field of Classification Search .................... 257/2, 257/3, 4, 295, 300, 303, 309, 310
See application file for complete search history.

(56) References Cited

U.S. PATENT DOCUMENTS 5,920,788 A * 7/1999 Reinberg .................... 438/466
6,507,061 B1    1/2003 Hudgens et al. ............ 257/295
2001/0034078 A1 * 10/2001 Zahorik et al. ................ 438/95

* cited by examiner

*Primary Examiner*—Howard Weiss
*Assistant Examiner*—(Vikki) Hoa B. Trinh
(74) *Attorney, Agent, or Firm*—Myers Bigel Sibley & Sajovec

(57) ABSTRACT

An integrated circuit memory device includes a semiconductor substrate and a first electrically insulating layer that extends on the semiconductor substrate and has a first contact hole extending therethrough. An electrically conductive plug is provided in the first contact hole. A phase-change material layer pattern is provided as a non-volatile storage medium. The phase-change material layer pattern has a bottom surface that is electrically connected to the electrically conductive plug. A second electrically insulating layer is provided on the phase-change material layer pattern. The second electrically insulating layer has a second contact hole therein. This contact hole exposes a portion of an upper surface of the phase-change material layer pattern. To improve data writing efficiency, the area of the exposed portion of the upper surface of the phase-change material layer pattern is less than a maximum cross-sectional area of the electrically conductive plug. A plate electrode is also provided. This plate electrode is electrically connected to the phase-change material layer pattern. Barrier layers may also be provided directly on the plug and directly on the exposed portion of the upper surface.

14 Claims, 6 Drawing Sheets

INTEGRATED CIRCUIT MEMORY DEVICES HAVING MEMORY CELLS THEREIN THAT UTILIZE PHASE-CHANGE MATERIALS TO SUPPORT NON-VOLATILE DATA RETENTION

REFERENCE TO PRIORITY APPLICATION

This application claims priority to Korean Application No. 2002-25009, filed May 7, 2002, the disclosure of which is hereby incorporated herein by reference.

FIELD OF THE INVENTION

The present invention relates to integrated circuit memory devices and methods of forming same and, more particularly, to non-volatile memory devices and methods of forming non-volatile memory devices.

BACKGROUND OF THE INVENTION

Semiconductor memory devices can be classified into volatile memory devices and non-volatile memory devices. The volatile memory devices lose their stored data when their power supplies are interrupted, however non-volatile memory devices retain their stored data even when their power supplies are interrupted. Thus, non-volatile memory devices are widely used in memory cards, mobile telecommunication systems and other devices that are susceptible to power interruption.

Non-volatile memory devices typically employ flash memory cells having stacked gate structures. Each of the stacked gate structures comprises a tunnel oxide layer, a floating gate, an inter-gate dielectric layer and a control gate electrode, which are sequentially stacked on a channel region of a transistor. To enhance reliability and program efficiency of the flash memory cell, the film quality of the tunnel oxide layer can be improved and a coupling ratio of the cell can be increased. Recently, a phase change memory cell has been proposed as an alternative to the flash memory cell.

FIG. 1 is a cross sectional view showing a data storage element that is employed in a conventional phase change memory cell. Other conventional memory devices that utilize phase-change materials are disclosed in U.S. Pat. No. 6,507,061. Referring to FIG. 1, a lower interlayer insulation layer 3 is disposed on a semiconductor substrate 1. A predetermined region of the semiconductor substrate 1 is exposed by a contact hole 5a that passes through the lower interlayer insulation layer 3. The contact hole 5a generally has a positive sloped sidewall. In other words, an upper diameter of the contact hole 5a is greater than a lower diameter thereof. In particular, the higher the aspect ratio of the contact hole 5a, the greater the narrowing of the contact hole 5a. This is due to a characteristic of dry etch processes that are typically used in the formation of the contact hole 5a. Accordingly, if the thickness of the lower interlayer insulation layer 3 is increased, the substrate 1 may not be exposed even though the dry etch process for forming the contact hole 5a is performed for a long duration. The contact hole 5a is filled with a conductive plug 5b. A void 5c or seam may be formed inside the conductive plug 5b. The void 5c or seam is generated during formation of the conductive plug 5b. In the event that the aspect ratio of the contact hole 5a is high, the void 5c or seam can be easily formed.

A phase change material layer pattern 7 and a top electrode 9 are sequentially stacked on the substrate having the conductive plug 5b. The phase change material layer pattern 7 covers the conductive plug 5b. The phase change material layer pattern 7 is typically formed of a material that exhibits two stable states according to temperature. For example, the phase change material layer pattern 7 may be formed of a GeSbTe layer (hereinafter, referred to as a GST layer). In more detail, if the GST layer is heated to a temperature higher than the melting point and cooled down rapidly, the GST layer will have an amorphous state, which is a relatively high resistance state. On the contrary, if the GST layer is heated to a temperature between the melting point and a crystallization temperature and cooled down, the GST layer will have a crystalline state, which is a lower resistance state. Thus, the GST layer operates as a programmable resistor, having high and low resistance states that determine whether the memory cell is storing a logic 0 or a logic 1 value. The GST layer can be heated by current that flows through the GST layer. It may be advantageous to decrease the contact area between a conductive plug 5b and the phase change material layer pattern 7 in order to reduce the power that is needed for phase transition of the GST layer. In other words, it is preferable that the upper diameter of the contact hole 5a be decreased. However, if the upper diameter of the contact hole 5a is reduced, the semiconductor substrate 1 may not be exposed. This is because the sidewall of the contact hole 5a has a positive slope as mentioned in the foregoing description.

The GST layer can react with a conductive layer such as a doped polysilicon layer. When the GST layer reacts with the polysilicon layer, silicon atoms in the polysilicon layer migrate into the GST layer and increase the resistance of the GST layer. When this occurs, it becomes more difficult to use the GST layer as a phase change material layer. To address this problem, the conductive plug 5b and the top electrode 9, which are in direct contact with the phase change material layer pattern 7, are typically formed of a stable material layer that does not react with the phase change material layer pattern 7. For instance, a metal nitride layer, such as a titanium nitride layer, is widely used in formation of the conductive plug 5b and the top electrode 9. The lower interlayer insulation layer 3, which surrounds the phase change material layer pattern 7, is covered with an upper interlayer insulation layer 11. A plate electrode 13 is disposed on the upper interlayer insulation layer 11, and the plate electrode 13 is electrically connected to the top electrode 9.

As described hereinabove, voids or seams can be formed in the conductive plugs 5b. Therefore, the phase-change material may fill the voids or the seams during fabrication. To prevent this, the contact area between the phase-change material layer pattern and the conductive plug is typically increased, but this increase in contact area can degrade the operating characteristic of the phase-change memory cell by increasing the power required during a writing operation.

SUMMARY OF THE INVENTION

Integrated circuit memory devices according to embodiments of the present invention contain memory cells that utilize phase-change materials to provide non-volatile storage. According to preferred aspects of these embodiments, operations to write cells with new data are performed more efficiently by limiting the contact area between a plate electrode and the phase-change material layer that is programmed using resistive heating. Memory cells according to embodiments of the present invention include a first electrically conductive barrier layer and a phase-change material layer pattern that extends on the first electrically conductive barrier layer. An electrically insulating layer, which extends on the phase-change material layer pattern, is used to limit the contact area to the phase-change material layer pattern so that efficient programming of the phase-change material layer pattern can be achieved. The electrically insulating layer is provided with a contact hole therein. The contact hole exposes only a relatively small portion of an upper surface of the phase-change material layer pattern. In order to protect the phase-change material layer, an electrically conductive non-phase-change material region is provided on the exposed portion of the upper surface of the phase-change material layer pattern. This material region may include a barrier region formed of the same material as the barrier layer. An electrode, such as a plate electrode, is provided on the material region. In this manner, an electrical connection can be provided between the electrode and the phase-change material layer, with the material region acting to protect the phase-change material layer from contamination.

In some embodiments, the phase-change material layer pattern may be formed of a chalcogenide alloy, such as a GeSbTe alloy. The first electrically conductive barrier layer and the non-phase-change material region may be formed of a metal nitride. The size of the opening in the contact hole may be kept relatively small by using insulating spacers that extend between the electrically conductive non-phase-change material region and a sidewall of the contact hole.

Additional memory device embodiments of the present invention include a semiconductor substrate and a first electrically insulating layer that extends on the semiconductor substrate and has a first contact hole extending therethrough. An electrically conductive plug is provided in the first contact hole. A phase-change material layer pattern is provided on the electrically conductive plug. In particular, the phase-change material layer pattern is provided having an underside that is electrically connected to the electrically conductive plug. A second electrically insulating layer extends on the phase-change material layer pattern. The second electrically insulating layer has a second contact hole therein that exposes a portion of an upper surface of the phase-change material layer pattern. This exposed portion of the upper surface has an area that is less than a maximum cross-sectional area of the electrically conductive plug. An electrode, such as a plate electrode, extends on the second electrically insulating layer and is electrically connected to the phase-change material layer pattern, via the second contact hole.

According to preferred aspects of these embodiments, a first barrier layer pattern is disposed between the electrically conductive plug and the phase-change material layer pattern and a second barrier layer is disposed between the upper surface of the phase-change material layer pattern and the electrode. An oxidation resistant layer pattern may also be used to protect the phase-change material layer pattern. In particular, the oxidation resistant layer pattern may be provided directly on the upper surface of the phase-change material layer pattern. This oxidation resistant layer pattern may consist of a material that operates to inhibit oxidation of the phase-change material layer pattern. Such materials include SiN, BN, SiC and ZnS, for example. Still further embodiments of the present invention include methods of forming integrated circuit memory devices having phase-change material layer patterns therein that are electrically connected to electrodes (e.g., plate electrodes) through relatively narrow contact holes. These contact holes may be further narrowed using sidewall spacers that are formed within the contact hole.

BRIEF DESCRIPTION OF THE DRAWINGS

FIGS. 3–5 and 7 are cross-sectional views of intermediate structures that illustrate methods of forming non-volatile memory devices according to other embodiments of the present invention.

DESCRIPTION OF PREFERRED EMBODIMENTS

Figure 1:
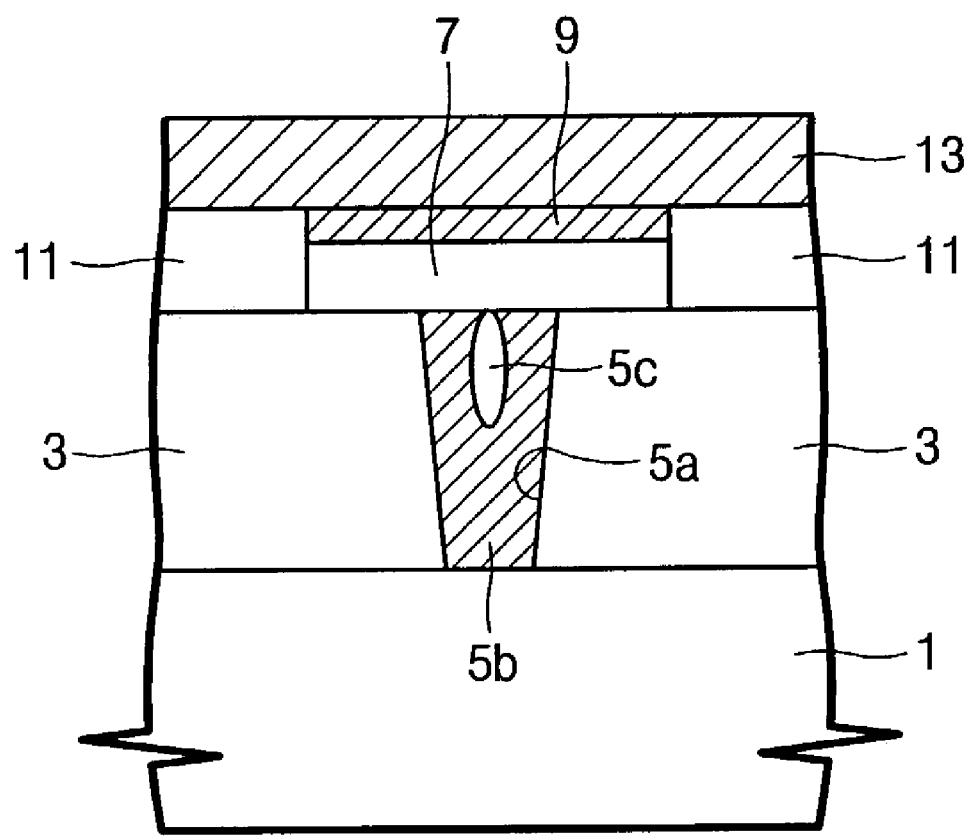
FIG. 1 is a cross-sectional view of a conventional non-volatile memory cell.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout the specification.

Figure 2A:
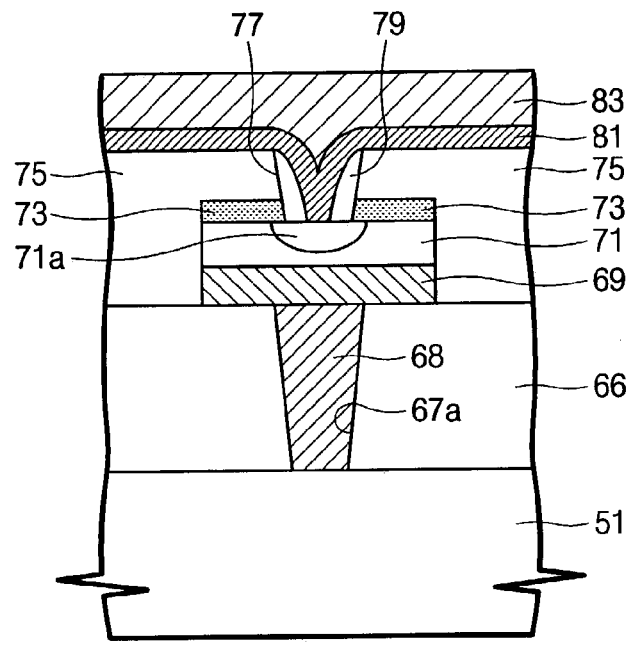
FIG. 2A is a cross-sectional view of a non-volatile memory cell according to an embodiment of the present invention.

FIG. 2A is a cross-sectional view that illustrates a phase-change memory cell according to one embodiment of the present invention. Referring to FIG. 2A, a data storage element is disposed on a semiconductor substrate 51. The data storage element comprises a first barrier layer pattern 69 and a phase-change material layer pattern 71, which are sequentially stacked. A lower interlayer insulation layer 66 may be disposed between the data storage element and the semiconductor substrate 51. In this case, a predetermined region of the semiconductor substrate 51 is exposed by a storage node contact hole 67a that passes through the lower interlayer insulation layer 66. The storage node contact hole 67a is filled with a conductive storage node plug 68. A top surface of the storage node plug 68 is in contact with the first barrier layer pattern 69. The phase-change material layer pattern 71 comprises a material layer that has at least two stable states that may be established reversibly through resistive heating. In some other embodiments, the pattern 71 may have four stable states, with each state characterized by a different resistance value. These four states may be treated as storing two bits of binary data. For example, the phase-change material layer pattern 71 may be a GST (GeSbTe) layer. GST is a chalcogenide alloy. Chalcogenide alloys contain one or more elements from column VI of the periodic table. It is preferable that the first barrier layer pattern 69 is an electrically conductive layer that does not react with the phase-change material layer pattern 71. For instance, the first barrier layer pattern 69 is preferably a metal nitride layer such as a titanium nitride (TiN) layer, a TiAlN layer, a TiBN layer, a TiSiN layer, a tantalum nitride (TaN) layer, a TaAlN layer, a TaBN layer, a TaSiN layer, a tungsten nitride (WN) layer, a WBN layer, a WSiN layer, a WAlN layer, a zirconium nitride (ZrN) layer, a ZrSiN layer, a ZrAlN layer, a ZrBN layer or a molybdenum nitride (MoN) layer.

The substrate 51 is covered with an upper interlayer insulation layer 75, which is an electrically insulating layer. It is preferable that an oxidation resistant layer pattern 73 be disposed between the upper interlayer insulation layer 75 and the phase-change material layer pattern 71. The oxidation resistant layer pattern 73 inhibits the phase-change material layer pattern 71 from being oxidized. The oxidation resistant layer pattern 73 may be a silicon nitride (SiN) layer, a boron nitride (BN) layer, a SiC layer or a ZnS layer, for example. It is preferable that a total thickness of the oxidation resistant layer pattern 73 and the upper interlayer insulation layer 75 thereon is relatively small compared to the thickness of the lower interlayer insulation layer 66.

A predetermined portion of the phase-change material layer pattern 71 is exposed by a plate electrode contact hole 77 that passes through the upper interlayer insulation layer 75 and the oxidation resistant layer pattern 73. An area of the exposed phase-change material layer pattern 71 is preferably smaller than the contact area between the storage node plug 68 and the first barrier layer pattern 69. In addition, a sidewall of the plate electrode contact hole 77 may be covered with an insulating spacer 79. In this case, it is possible to further reduce the area of the exposed phase-change material layer pattern 71.

An inner wall of the plate electrode contact hole 77 and a top surface of the upper interlayer insulation layer 75 are covered with a second barrier layer pattern 81. In the event the sidewall of the plate electrode contact hole 77 is covered with the spacer 79, the second barrier layer pattern 81 conformably covers the sidewall of the spacer 79, the surface of the exposed phase-change material layer pattern 71 and the top surface of the upper interlayer insulation layer 75. Also, it is preferable that the second barrier layer pattern 81 is the metal nitride layer. A plate electrode 83 is stacked on the second barrier layer pattern 81. A low aspect ratio of the plate electrode contact hole 77 can be achieved because the portion of the upper interlayer insulation layer 75 that extends on top of the oxidation resistant layer pattern 73 can be formed to a thickness that is smaller than that of the lower interlayer insulation layer 66. As a result, voids or seams are typically not formed in the second barrier layer pattern 81 or the plate electrode 83 that fills the plate electrode contact hole 77.

If the phase-change material layer pattern 71 is heated in order to write data (logic 1 or logic 0) into the phase-change memory cell, a portion 71a of the phase-change material layer pattern 71 that is in contact with the second barrier layer pattern 81 is changed into either a crystalline state or an amorphous state, through resistive heating. Conventional techniques can be used to "read" the memory cell once it has been programmed.

Figure 2B:
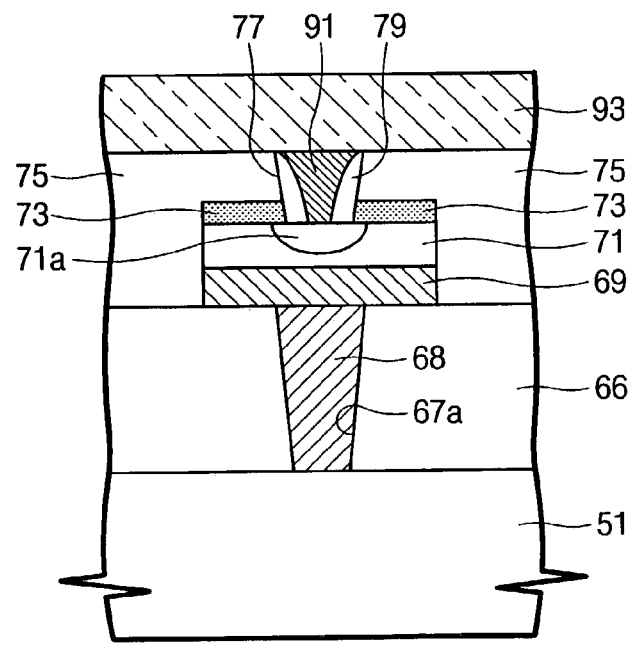
FIG. 2B is a cross-sectional view of a non-volatile memory cell according to an embodiment of the present invention.

FIG. 2B is a cross-sectional view for illustrating a phase-change memory cell according to another embodiment of the present invention. Referring to FIG. 2B, the lower interlayer insulation layer 66, the data storage element, the upper interlayer insulation layer 75, the plate electrode contact hole 77 and the spacer 79, which have already been explained in the first embodiment, are disposed on the semiconductor substrate 51. According to this embodiment, however, the plate electrode contact hole 77 is completely filled with a second barrier layer pattern 91, which has the plug shape shown in FIG. 2B. A plate electrode 93 is disposed on the substrate having the second barrier layer pattern 91. Thus, the plate electrode 93 is in direct contact with the upper interlayer insulation layer 75.

Figure 3:
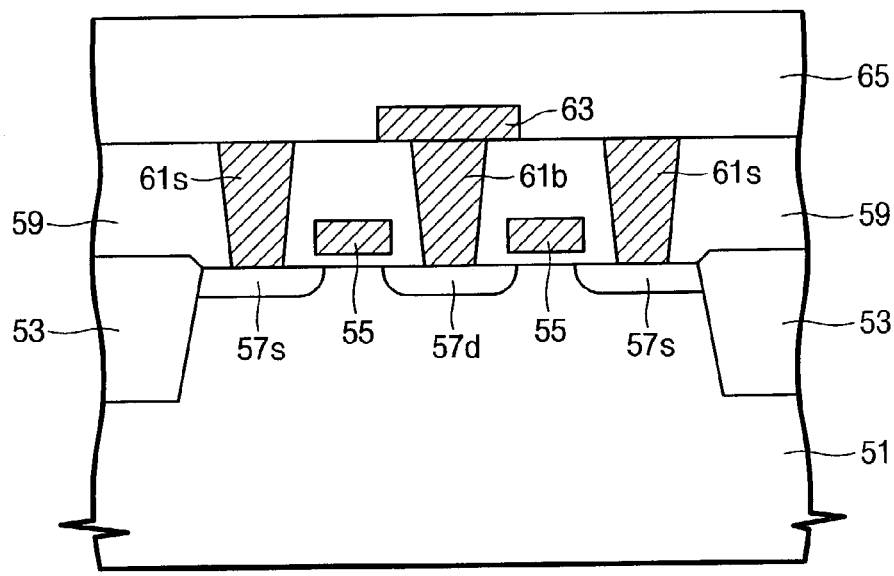
FIGS. 3–6 are cross-sectional views of intermediate structures that illustrate methods of forming non-volatile memory devices according to some embodiments of the present invention.

FIGS. 3 to 6 are cross-sectional views that illustrate methods of forming phase-change memory cells according to an embodiment of the invention. Referring to FIG. 3, an isolation layer 53 is formed at a predetermined region of a semiconductor substrate 51 to define a plurality of active regions. The isolation layer 53 can be formed using a conventional manner such as a trench isolation technique. A plurality of insulated word lines 55 are formed on the substrate having the isolation layer 53. The word lines 55 are formed to cross over the active regions. The pair of word lines 55 are formed across the respective active regions. Impurity ions are implanted into the active regions using the word lines 55 and the isolation layer 53 as ion implantation masks. As a result, a common drain region 57d and two source regions 57s are formed in the substrate 51. The common drain region 57d is formed at the active region between the pair of word lines 55, and the source regions 57s are formed at both ends of each of active region, respectively. The pair of word lines 55, the common drain region 57d and the source regions 57s constitute a pair of access transistors.

A first lower interlayer insulation layer 59 is formed on an entire surface of the substrate having the access transistors. The first lower interlayer insulation layer 59 is patterned to form bit line pad contact holes exposing the common drain regions 57d and storage node pad contact holes exposing the source regions 57s. Bit line pads 61b and storage node pads 61s are formed in conventional manner in the bit line pad contact holes and the storage node pad contact holes, respectively. A plurality of bit lines 63 crossing over the word lines 55 are formed on the first lower interlayer insulation layer 59. The bit lines 63 are electrically connected to the bit line pads 61b. A second lower interlayer insulation layer 65 is formed on an entire surface of the substrate having the bit lines 63. The first and second lower interlayer insulation layers 59 and 65 can be formed as a silicon oxide layer.

Figure 4:
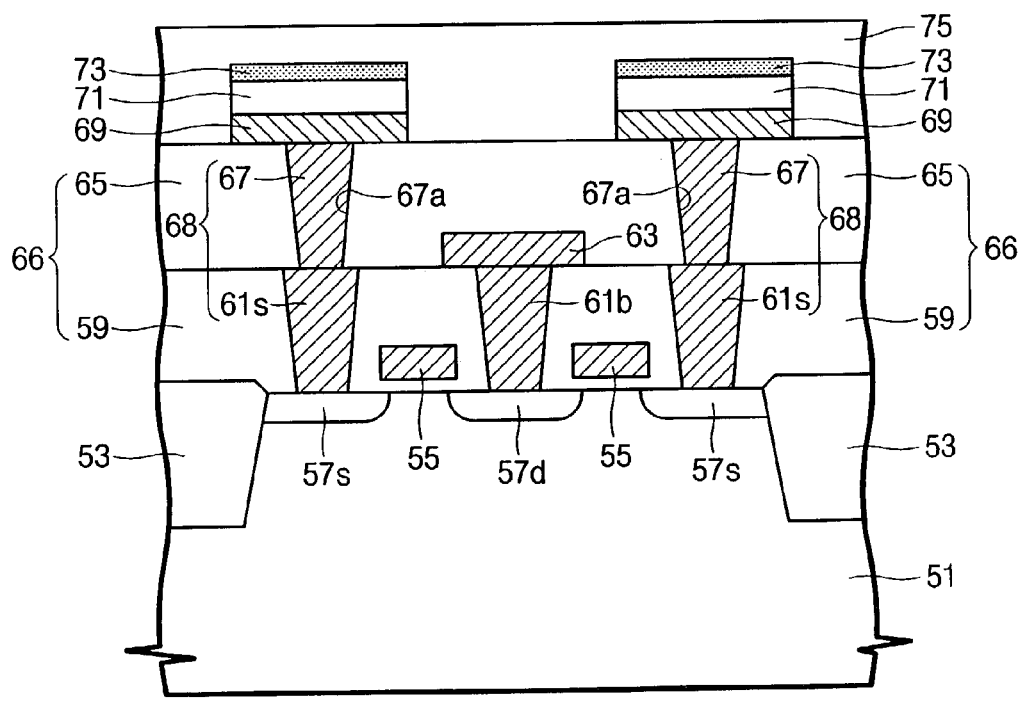

Referring to FIG. 4, the second lower interlayer insulation layer 65 is patterned to form a plurality of storage node contact holes 67a that expose the storage node pads 61s. In the event that the process for forming the storage node pads 61s is omitted, the storage node contact holes 67a can be formed by patterning a lower interlayer insulation layer 66 composed of the first and second interlayer insulation layers 59 and 65. Storage node plugs 67 are formed in a conventional manner in the storage node contact holes 67a. The respective storage node pads 61s and the respective storage node plugs 67 stacked thereon constitute a conductive plug 68. The conductive plug 68 does not act as a conventional heating plug. Accordingly, it is not required to reduce the upper diameter of the storage node contact holes 67a in order to minimize power consumption in a writing mode. In other words, there is no limitation in photolithography and etch processes for forming the storage node contact holes 67a, since the upper diameter of the storage node contact holes 67a can be increased.

The storage node plugs 67 are preferably formed as a doped polysilicon layer using a low pressure chemical vapor deposition (LPCVD) technique. The doped polysilicon layer may be formed using the LPCVD technique, because it exhibits excellent step coverage. Thus, LPCVD can be used to prevent voids or seams from being formed in the storage node plugs 67.

A first barrier layer and a phase-change material layer are sequentially formed on the substrate including the storage node plugs 67. The first barrier layer is preferably formed of a conductive layer that does not react with the phase-change material layer. For example, the first barrier layer is preferably formed of a metal nitride layer such as a titanium nitride (TiN) layer, a TiAlN layer, a TiBN layer, a TiSiN layer, a tantalum nitride (TaN) layer, a TaAlN layer, a TaBN layer, a TaSiN layer, a tungsten nitride (WN) layer, a WBN layer, a WSiN layer, a WAlN layer, a zirconium nitride (ZrN) layer, a ZrSiN layer, a ZrAlN layer, a ZrBN layer or a molybdenum nitride (MoN) layer. Also, the phase-change material layer is formed of a material layer that has two stable states (i.e., a crystalline state or an amorphous state) that can be achieved through resistive heating. For example, the phase-change material layer can be formed as a chalcogenide alloy, such as an alloy containing germanium (Ge), antimony (Sb) and tellurium (Te).

The phase-change material layer may be susceptible to oxidation. If the phase-change material layer is oxidized, its non-volatile characteristics may be degraded. In particular, in the event oxygen atoms infiltrate into the phase material layer, resistance of the phase-change material layer is increased and it may become difficult to crystallize the oxidized phase-change material layer to achieve a particular logic state. Accordingly, it is preferable that an oxidation resistant layer be formed on the phase-change material layer. As a result, the oxidation resistant layer is formed in order to prevent the phase-change material layer from being oxidized during subsequent processes. The oxidation resistant layer may be formed of a silicon nitride (SiN) layer, a boron nitride (BN) layer, a SiC layer or a ZnS layer, for example.

The oxidation resistant layer, the phase-change material layer and the first barrier layer are successively patterned to form a plurality of data storage elements covering the storage node plugs 67 and oxidation resistant layer patterns 73 stacked on the data storage elements. Each of the data storage elements is composed of a first barrier layer pattern 69 and a phase-change material layer pattern 71 stacked on the first barrier layer pattern 69. An upper interlayer insulation layer 75 is then formed on an entire surface of the substrate including the data storage elements and the oxidation resistant layer patterns 73. The upper interlayer insulation layer 75 is preferably formed to a thickness that is thinner than that of the lower interlayer insulation layer 66. In particular, the upper interlayer insulation layer 75 is preferably formed to a thickness that is thinner than that of the second lower interlayer insulation layer 65. Further, the upper interlayer insulation layer 75 is preferably formed of an insulation layer that has an etch selectivity with respect to the oxidation resistant layer patterns 73. For instance, the upper interlayer insulation layer 75 may be formed of a silicon oxide layer.

Figure 5:
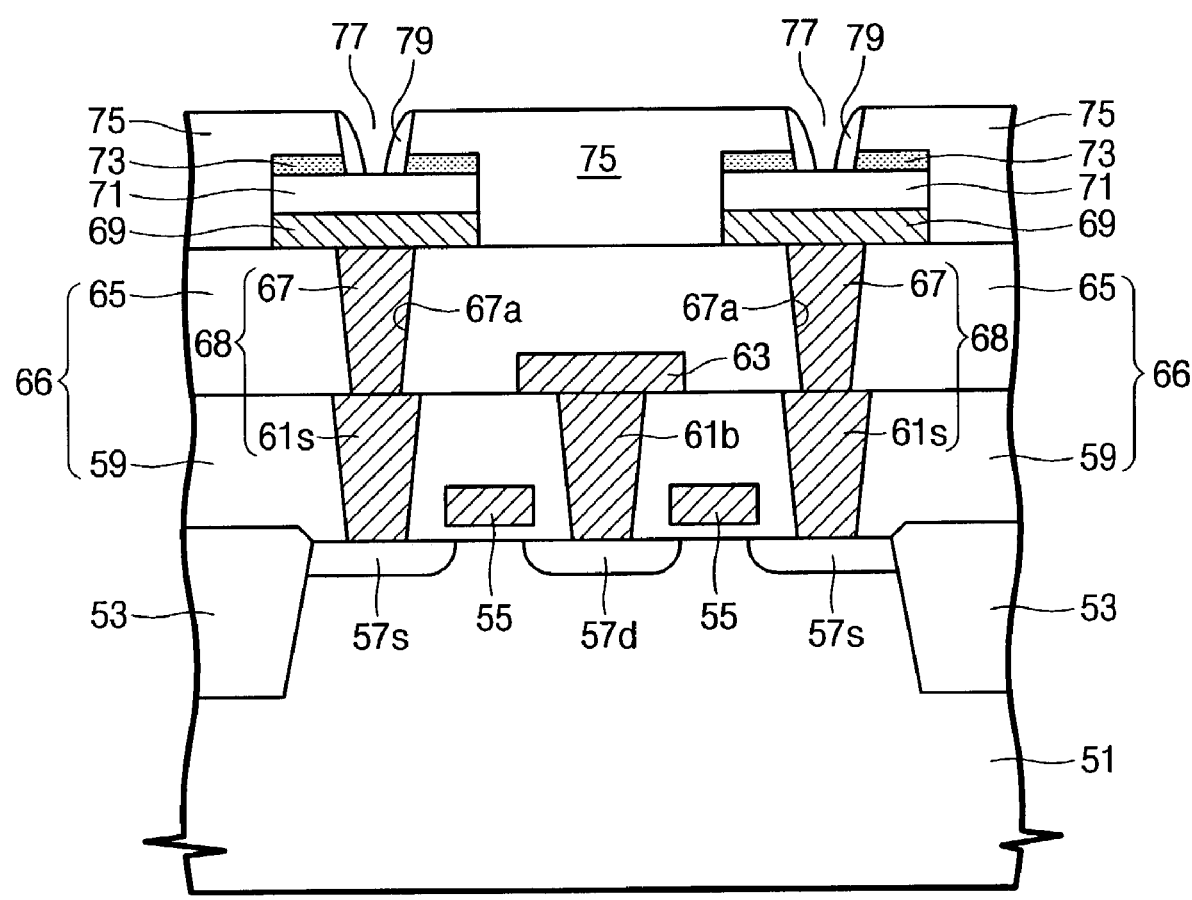

Referring to FIG. 5, the upper interlayer insulation layer 75 and the oxidation resistant layer patterns 73 are patterned to form plate electrode contact holes 77 that expose upper surfaces of the phase-change material layer patterns 71. It is preferable that lower diameters of the plate electrode contact holes 77 are smaller than upper diameters of the storage node contact holes 67a. Nevertheless, the plate electrode contact holes 77 may have lower aspect ratios relative to the storage node contact holes 67a. This is because the upper interlayer insulation layer 75 on the data storage elements is thinner than the second lower interlayer insulation layer 65.

The oxidation resistant layer patterns 73 act as etch stoppers while the upper interlayer insulation layer 75 is etched. Thus, it is possible to minimize over etching damage applied to the phase-change material layer patterns 71 during formation of the plate electrode contact holes 77. As a result, it can prevent the non-volatile characteristics of the phase-change material layer patterns 71 from being degraded. Insulating spacers 79 may be formed on sidewalls of the plate electrode contact holes 77 using conventional techniques. Thus, it is possible to further reduce the areas of the phase-change material layer patterns 71 that are exposed by the plate electrode contact holes 77. This is due to the presence of the, spacers 79. The insulating spacers 79 may be formed of a silicon oxide layer or a silicon nitride layer.

Figure 6:
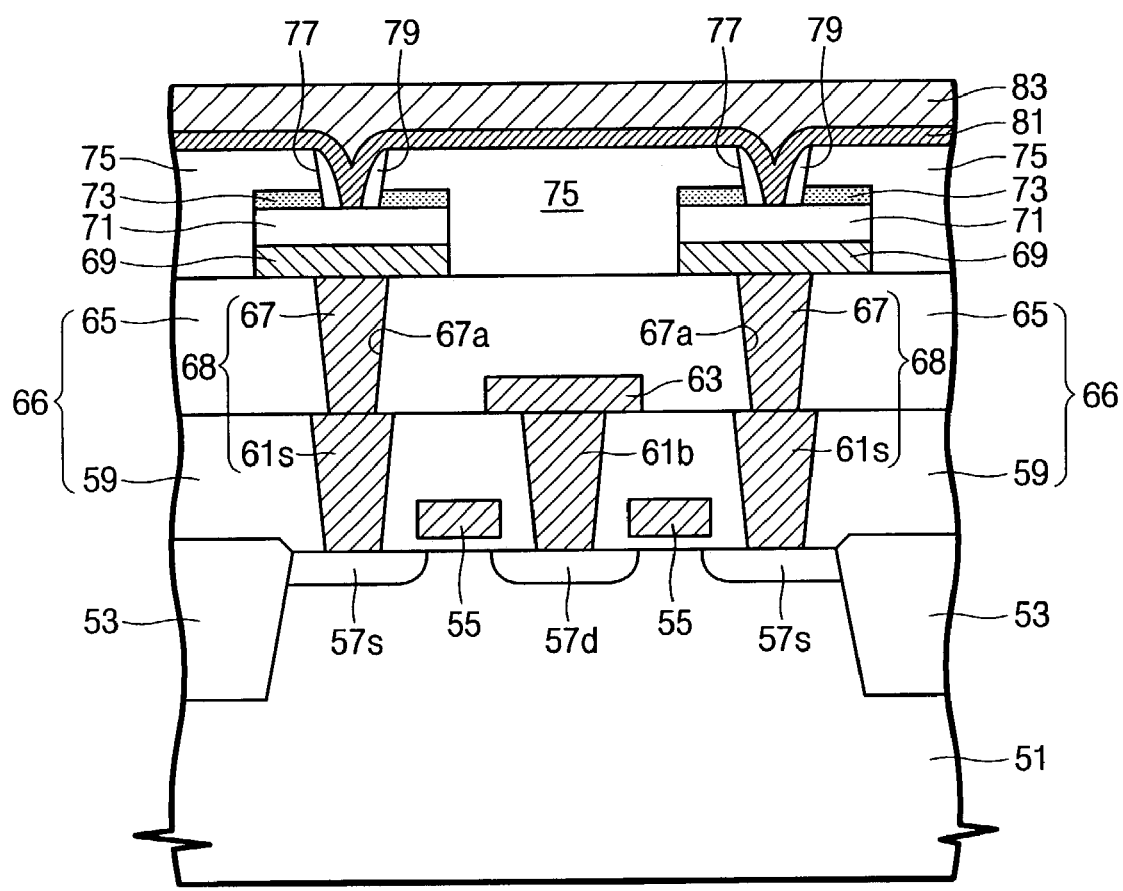

Referring to FIG. 6, a second barrier layer 81 is conformally formed on an entire surface of the substrate having the spacers 79. A plate electrode layer is then formed on the second barrier layer. The second barrier layer is preferably formed of a metal nitride layer like the first barrier layer. The plate electrode layer and the second barrier layer are successively patterned to form second barrier layer patterns 81 covering the plate electrode contact holes 77 as well as the upper interlayer insulation layer 75 therebetween and plate electrodes 83 stacked on the second barrier layer patterns 81. Here, the second barrier layer patterns 81 and the plate electrodes 83 are typically not susceptible to voids or seams within the plate electrode contact holes 77 as shown in FIG. 6. This is due to the low aspect ratio of the plate electrode contact holes 77.

Figure 7:
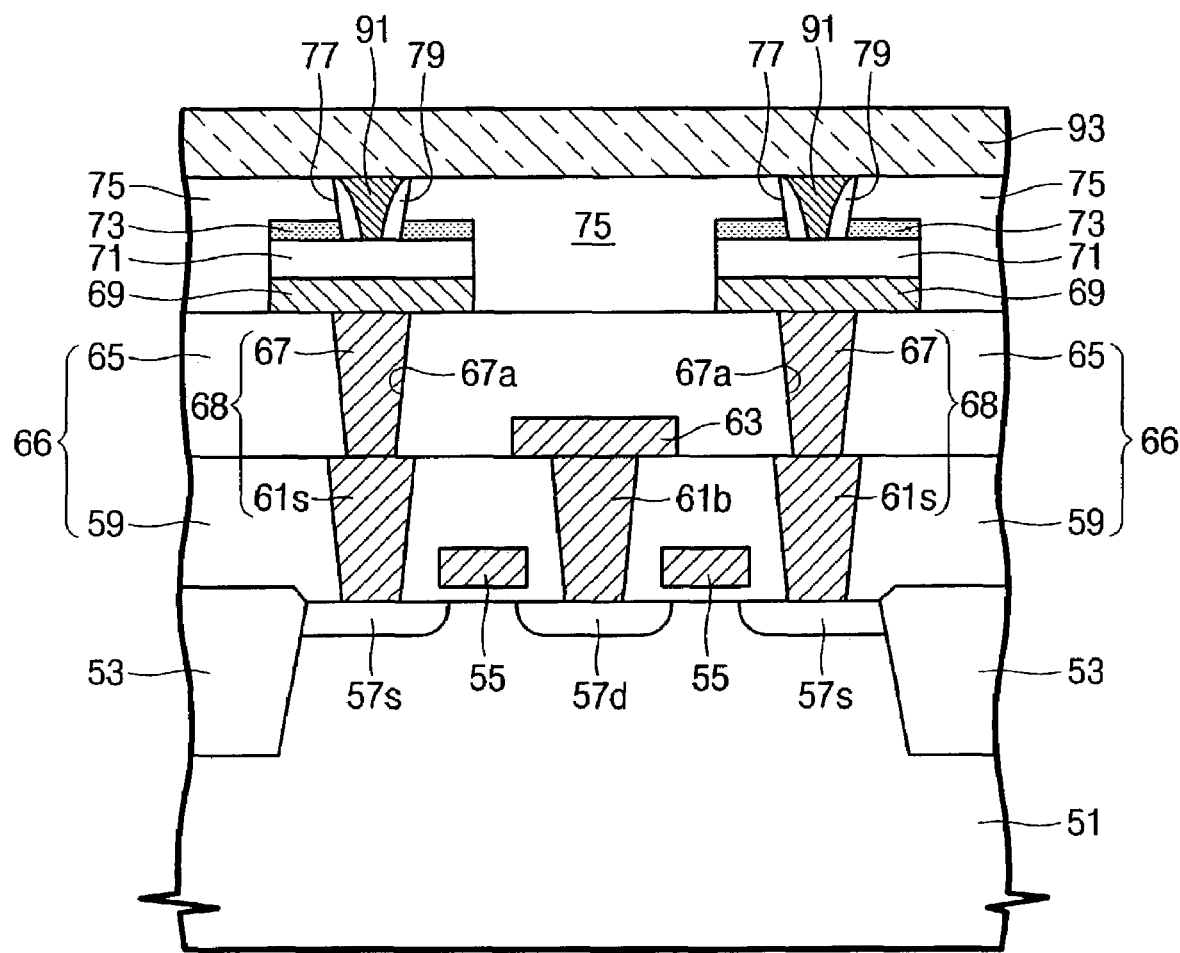

FIG. 7 is a cross-sectional view for illustrating a method of fabricating the phase-change memory cells according to another embodiment of the present invention. In this embodiment, access transistors, bit lines, data storage elements, plate electrode contact holes and spacers are formed as in the embodiments explained with reference to FIGS. 3 to 5. Thus, the explanations to the methods of forming the above-mentioned components can be omitted.

Referring to FIG. 7, a second barrier layer is formed on an entire surface of the substrate including the spacers 79. The second barrier layer is formed of the same material layer as that of the first embodiment. In this embodiment, however, it is preferable that the plate electrode contact holes 77 are completely filled with the second barrier layer. According to this embodiment, the second barrier layer in the plate electrode contact holes 77 can be formed without any voids or seams. This is due to the low aspect ratio of the plate electrode contact holes 77 as described in FIG. 6. The second barrier layer is planarized until the top surface of the upper interlayer insulation layer 75 is exposed, thereby forming second barrier layer patterns 91 in the plate electrode contact holes 77. Accordingly, the second barrier layer patterns 91 have a plug shape. Plate electrodes 93 are formed on the substrate having the second barrier layer patterns 91, using a conventional deposition technique.

According to the embodiments of the invention as described above, a second barrier layer pattern, which is stacked on the phase-change material layer pattern, can be formed without any voids or seams. Also, it is possible to significantly reduce the contact area between the phase-change material layer pattern and the second barrier layer pattern. As a result, it is possible to decrease the power consumed during a write operation.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory cell, comprising:
   a first electrically conductive barrier layer;

a phase-change material layer pattern extending on and contacting an upper surface of said first electrically conductive barrier layer;

an electrically insulating layer extending on said phase-change material layer pattern and having a contact hole therein; and an electrically conductive non-phase-change material region extending through the contact hole and contacting less than an entire upper surface of said phase-change material layer pattern.

2. The memory cell of claim 1, wherein said phase-change material layer pattern comprises a chalcogenide alloy.

3. The memory cell of claim 2, wherein the chalcogenide alloy is a GeSbTe alloy.

4. The memory cell of claim 1, wherein said first electrically conductive barrier layer comprises a first metal nitride barrier layer; and wherein said electrically conductive non-phase-change material region comprises a second metal nitride barrier layer.

5. The memory cell of claim 1, further comprising an insulating spacer that extends between said electrically conductive non-phase-change material region and a sidewall of the contact hole.

6. An integrated circuit memory cell, comprising:
a semiconductor substrate;
a first electrically insulating layer that extends on said semiconductor substrate and has a first contact hole extending therethrough;
an electrically conductive plug that extends in the first contact hole;
a phase-change material layer pattern having a bottom surface that is electrically connected to said electrically conductive plug;
a second electrically insulating layer that extends on said phase-change material layer pattern, said second electrically insulating layer having a second contact hole therein that exposes a reduced portion of an upper surface of said phase-change material layer pattern having an area that is less than a maximum cross-sectional area of said electrically conductive plug; and
a non-phase-change material layer that extends through the second contact hole and contacts the reduced portion of the upper surface of said phase-change material layer pattern so that an area of contact between the upper surface of said phase-change material layer and said non-phase-change material layer is less than the maximum cross-sectional area of said electrically conductive plug.

7. The memory cell of claim 6, further comprising:
a first barrier layer pattern disposed between said electrically conductive plug and said phase-change material layer pattern.

8. The memory cell of claim 7, further comprising an insulating spacer that extends between said non-phase-change material layer and a sidewall of the second contact hole.

9. The memory cell of claim 6, wherein said phase-change material layer pattern comprises a chalcogenide alloy.

10. The memory cell of claim 7, wherein said first barrier layer pattern and said non-phase-change material layer comprise metal nitride.

11. An integrated circuit memory cell, comprising:
a semiconductor substrate;
a first electrically insulating layer that extends on said semiconductor substrate and has a first contact hole extending therethrough;
an electrically conductive plug that extends in the first contact hole;
a first barrier layer pattern extending on and contacting said electrically conductive plug;
a phase-change material layer pattern extending on and contacting said first barrier layer pattern;
an oxidation resistant layer pattern extending on contacting an upper surface of said phase-change material layer pattern;
a second electrically insulating layer that extends on said oxidation resistant layer pattern, said second electrically insulating layer and said oxidation resistant layer pattern having a second contact hole that extends therethrough and exposes a reduced portion of an upper surface of said phase-change material layer pattern;
a second barrier layer that extends into the second contact hole and contacts the reduced portion of the upper surface of said phase-change material layer pattern so that an area of contact between said second barrier layer and the reduced portion of the upper surface of said phase-change material layer pattern is less than a maximum cross-sectional area of said electrically conductive plug;
a plate electrode on said second barrier layer; and
an access transistor that extends in said semiconductor substrate and has a source region that is electrically connected to said electrically conductive plug.

12. The memory cell of claim 11, further comprising an insulating spacer that extends between said second barrier layer and a sidewall of the second contact hole.

13. The memory cell of claim 11, wherein said phase-change material layer pattern comprises a chalcogenide alloy.

14. The memory cell of claim 11, wherein said oxidation resistant layer pattern comprises a material selected from the group consisting of SiN, BN, SiC and ZnS.

* * * * *